United States Patent [19]
Moscovici

[11] Patent Number: 4,779,012
[45] Date of Patent: Oct. 18, 1988

[54] TRACK-AND-HOLD AMPLIFIER

[75] Inventor: Alfi Moscovici, El Paso, Colo.

[73] Assignee: Honeywell Inc., Minneapolis, Minn.

[21] Appl. No.: 85,056

[22] Filed: Aug. 12, 1987

[51] Int. Cl.⁴ .............................................. G11C 27/02
[52] U.S. Cl. .................... 307/353; 307/572; 328/151
[58] Field of Search ................. 307/353, 572; 328/151

[56] References Cited
FOREIGN PATENT DOCUMENTS
0207794 3/1984 Fed. Rep. of Germany ...... 307/353

Primary Examiner—John Zazworsky
Attorney, Agent, or Firm—Kinney & Lange

[57] ABSTRACT

A track-and-hold amplifier system with an added switching means for adding compensatory signals to a second input of an operational amplifier used in the system.

7 Claims, 3 Drawing Sheets

TRACK-AND-HOLD AMPLIFIER

BACKGROUND OF THE INVENTION

Field of the Invention

The present invention relates to track-and-hold amplifiers and, more particularly, to track-and-hold amplifiers using an operational amplifier with switching between alternative feedback and input configurations to therefor change from one operating mode to another.

In signal processing, there is often a need to provide, for a selected duration of time, the immediately preceding value taken by a varying analog signal. A typical situation in which this occurs is in connection with providing digital representations of amplitude values of an analog voltage signal, i.e. analog-to-digital conversions.

For such conversions, a succession of amplitude values of a varying analog signal is selected for conversion to digital representations, each such amplitude value being acquired after a selected interval has elapsed since the preceding acquisition. Often, the best conversion result can be provided if the input signal to the converter maintains a substantially constant value at the input to the analog-to-digital converter during the conversion process. A well-known kind of circuit for providing, for a selected duration of time, a substantially constant value for each of the selected analog values is a track-and-hold amplifier.

The rate at which a track-and-hold amplifier can provide such substantially constant values, each based on the value of an analog signal applied to the amplifier input at a selected time, is determined by the amount of time the amplifier takes to settle into each of its two operating modes. One of these modes is the track mode in which the amplifier output signal is substantially a reproduced version of the input signal ("tracks" this signal). The other mode is the hold mode in which the amplifier output signal provides a substantially constant value representing the input signal at the time of switching into the hold mode. A conversion to a digital representation during a hold period of the track-and-hold amplifier cannot be permitted to begin until the transients, occurring as the result of switching into the hold mode, have expired and a substantially constant voltage has been reached at the amplifier output for the duration of that hold mode. Thereafter, the track-and-hold amplifer, after having been switched back into the track mode of operation, cannot be permitted to be switched again into the hold mode until the transients occurring from the switching into the track mode have expired so that the amplifier output again represents the analog voltage currently appearing at its input.

Thus, these two settling times, added to one another, represent the shortest time interval between conversions that can be permitted if such a track-and-hold amplifier is to provide reasonably accurate values for the subsequent conversion to digital equivalents. The reciprocal of this sum of settling times is the highest conversion frequency which can be accurately achieved. Similarly, in other uses, these settling times limit the rate that a track-and-hold amplifier can switch between operating modes.

A single signal at a single input amplifier using an operational differential amplifier, as opposed to a differential signal, will result in imbalances in the stored charge on parasitic capacitances occurring at this input which will lead to longer settling times. Thus, there is desired a track-and-hold amplifier configuration which will counteract such effects to reduce settling times.

SUMMARY OF THE INVENTION

The present invention provides a track-and-hold amplifier system having an additional switching means to add compensatory signals to a second input of an operational amplifier used in the system to thereby counteract unwanted effects at the operational amplifier first input.

DETAILED DESCRIPTION OF THE PREFERRED EMBODIMENTS

Figure 1:
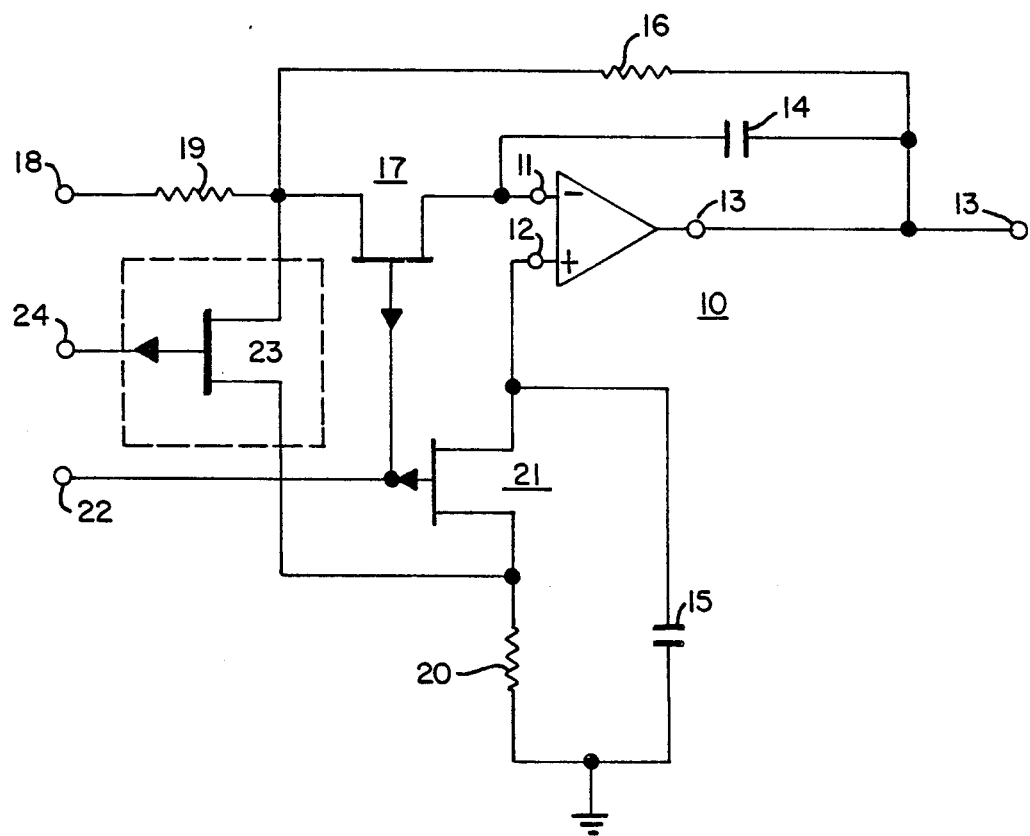
FIG. 1 shows a circuit schematic diagram of the present invention.

FIG. 1 shows a circuit schematic diagram of the track-and-hold amplifier system of the present invention. Such a system typically has an operational amplifier, 10, capable of very good performance, having an inverting input, 11, and a non-inverting input, 12. Operational amplifier 10 also has an output, 13, which also serves as the output of the track-and-hold amplifier system of FIG. 1.

Typical parameters for track-and-hold amplifier systems capable of 0.01% accuracy will require an operational amplifier suitable for use for amplifier 10 of the circuit of FIG. 1 would be as follows: a zero frequency gain in excess of 100,000, a unity gain bandwidth greater than 20 MHz, and a slew-rate greater than 200 v/$\mu$sec. The common mode rejection ratio should be in the range of 100 dB. Input resistances should be in the megohm range while the output resistance should be no more than a few tens of ohms.

The offset current of operational amplifier 10 must be quite small in value for acceptable accuracy in many uses. The offset currents should be no more than a few nanoamps. In various applications, trade-offs between these values of the operational amplifier 10 parameters can be permitted, but usually an operational amplifier generally capable of high peformance will be necessary for rapid and accurate results.

In FIG. 1, operational amplifier 10 has a feedback capacitance, 14, connected between output 13 thereof and inverting input 11. A similar compensation capacitance, 15, is connected between non-inverting input 12 and the ground voltage reference. These capacitances 14 and 15 will typically be chosen to have as near identical parameters as reasonably possible for compensation purposes. In a monolithic integrated circuit, they might be chosen to each have capacitance values of about 50 pF and typically would be formed by use of a parallel plate capacitance structure having doped polycrystalline silicon separated by silicon dioxide.

A further feedback arrangement extends from output 13 of operational amplifier 10 but is only selectively connected to inverting input 11 thereof. This feedback structure comprises a feedback resistor, 16, and a switching means, 17, for selectively connecting it to inverting input 11. Switching means 17 is typically formed of a p-channel, junction field-effect transistor. Between the FIG. 1 amplifier system input, 18, and the junction of feedback resistor 16 and switch 17 there is connected an input resistance, 19.

A further resistor, 20, is selectively connected between the ground voltage reference and non-inverting input 12 of operational amplifier 10 by another p-channel, junction field-effect transistor, 21, serving also as a switch. The gates of the junction field-effect transistor serving as switches 17 and 21 are connected together in common and to a system control voltage input, 22.

Resistors 16 and 19 would typically have the same resistance values which might be 1000 Ω in a system formed in the monolithic integrate circuit, and these resistors would typically be formed of nickel-chrome alloy thin films. Resistor 20, to minimize the effects of offset currents in operational amplifier 10, would typically be chosen to be equal in resistance value to the resistance value of the parallel combination of resistors 16 and 19 or 500 Ω. The other parameters of these resistors would be matched as close as is reasonably possible for compensation purposes.

The circuit structure described to this point (excluding for now the component in the dashed line box of FIG. 1) operates in two operating modes, either the tracking mode or the hold mode, as set by the value of the control signal applied to control input 22. An analog signal which is to have selected values thereof each held for a certain duration at system output 13 is applied to system analog signal input 18. With switches 17 and 21 closed to have a low effective conductivity value of a few ohms or less, all of the circuit components described so far are active in the circuit as it operates in the tracking mode. That is, the output 13 will closely follow the value of the system input signal appearing at input 18 as long as its frequency content is substantially within the closed-loop bandwidth of the track-and-hold amplifier system. This bandwidth is primarily set by the resistance value of resistor 19 and the capacitance value of capacitor 14. Switches 17 and 21 are closed by there being a voltage applied at control input 22 which is less than the typical field-effect transistor threshold value of each which is typically 2 volts, the control signal at input 22 usually being set to zero volts in this mode.

By increasing the voltage at control signal input 22 to a positive voltage greater than the threshold values of the field-effect transistors serving as switches 17 and 21, these switches will be opened placing the system in the hold mode. Opening switches 17 and 21 has the effect of disconnecting resistors 16 and 19 from inverting input 11 and disconnecting resistor 20 from non-inverting input 12. Capacitance 15 remains connected to input 12 just as capacitance 14 remains connected to input 11 to provide symmetrical impedances at each of these inputs for compensation purposes. In this arrangement, the signal appearing at system output 13 will be a substantially constant voltage and equal in magnitude to that which has accumulated on capacitor 14 during the track mode of operation until the instant of switching. If the analog signal at input 18 is within the closed-loop bandwidth of the system, this output voltage will be that occurring at input 18 just before the switching of transistors 17 and 21 to start the hold mode.

Hence, this voltage on capacitor 14 will be presented at system output 13 and held substantially constant at that value until the control signal at control input 22 again closes switches 17 and 21 to thereby revert to the track mode. Again, capacitors 14 and 15 both remain in the circuit in either mode with capacitor 15 providing compensation action at input 12 to counter effects occurring at input 11 to which capacitor 14 is connected.

This operation just described results in system output waveforms at system output 13 which include switching transients due to switching between modes. An example of this is shown in the waveforms representing switching to the hold mode and back to the tracking mode presented in FIGS. 2A and 2B. The system of FIG. 1, including only the components described so far, begins in this example by being switched into the hold mode as initiated by a positive pulse being provided at control input 22 at time zero in the waveform shown in FIG. 2A. The value chosen to be present at system input 18 just prior to this switching is zero volts so that only switching transient information and error information will be present in the upper waveform of FIG. 2B. The result is shown in the upper waveform of FIG. 2B. An initial positive spike in the system output voltage signal, and the negative excursion following, is shown just after time zero in this upper graph in FIG. 2B. These occur because of the unavoidable parasitic capacitances present between the gates of switches 17 and 21 and the terminating regions of each, which regions are connected to one of the operational amplifier 10 inputs, that for switch 17 to inverting input 11 and for switch 21 to non-inverting input 12.

Since these parasitic capacitances are likely to be unequal, a differential voltage in response to the switching pulse in the control signal on input 22 will be established between inputs 11 and 12 of operational amplifier 10, and further, the control signal voltage pulse will be capacitivity coupled across feedback resistor 16 and the output impedance of amplifier 10 to provide the positive spike at amplifier output 13 and so the amplifier system output. The transient effects caused by this positive voltage spike, because of the interactions of other electrical energy storage means associated with amplifier 10 including capacitor 14, lead to the negative voltage excursion following the positive spike in the waveform before a steady value is reached at amplifier output 13. This steady or substantially constant value represents the value of the analog signal at input 18 just before switches 17 and 21 were opened to start the hold mode.

The electrical energy in these switching transients at the beginning of the hold mode is dissipated primarily in resistors 16 and 19 with a time constant depending on the resistance values of these resistors and some of the interacting storage means. These hold mode initial switching transients are assumed to have sufficiently expired when the final decay thereof comes within half of the least significant bit in the digital representation of the final steady value reached during the hold mode of operation, this criteria assuming use of the track-and-hold amplfier system in a digital conversion situation. This point can be seen to occur to the left in FIG. 2B at the negative peak of the negative excursion which intersects a horizontal line at the point of one of a pair of vertically spaced horizontal lines with arrows indicating 0.5 LSB, and occurs in the waveform of that figure approximately 10.0 ns after the initiation of the switching.

The final value at output 13 of operational amplifier 10 during the hold mode can be seen to be other than zero volts (the values between the arrows makred "pedestal" of about −3.5 to −4.0 mv) because of the differential voltage between inputs 11 and 12 due to the control voltage at switching being stored on different valued parasitic capacitances as described before. This differential voltage dissipates much more slowly because of the high input impedances of operational amplifier 10. The value of this error voltage is equal to the positive value of the switching voltage during the hold mode shown in the waveform in FIG. 2A times the ratio of the differences in parasitic capacitances from the gates of switches 17 and 21 to operational amplifier 10 divided by the average of the capacitance values of capacitors 14 and 15.

Figure 2A:
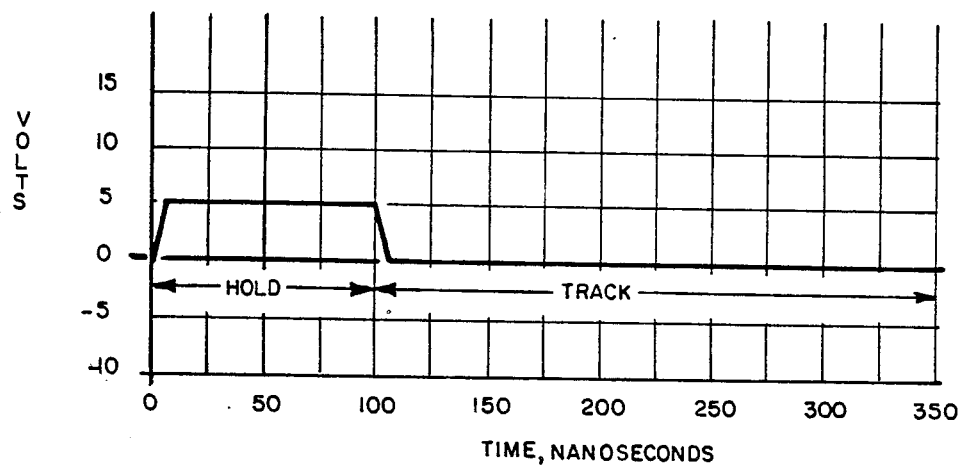
FIGS. 2A through 2C show signals representing the operation of the circuit indicated in the diagram of FIG. 1.

At the end of the hold mode, switches 17 and 21 are closed by removal from input 22 of the positive voltage in the control signal waveform shown in FIG. 2A to occur at a point in time shown there to be 100 ns. This action begins the subsequent track mode. This is shown to result immediately thereafter in the upper waveform of FIG. 2B in a negative voltage spike at output 13 of operational amplifier 10, and so the output of the amplifier system, because of the same factors involved in the initial positive spike in the hold mode. These factors are the parasitic capacitances from the gates of the field-effect transistors serving as switches 17 and 21 across these transistors to the terminating regions thereof connected to the inputs of operational amplifier 10, and the feedback about and the internal energy storage means in connection with operational amplifier 10. There is, however, additional energy in this instance because of the energy that has been stored in the parasitic capacitances while switches 17 and 21 were open. This contributes to a larger magnitude in the spike during the switching from the hold mode to the track mode compared with the reverse situation.

Again, the decay in these track mode initial transients occurs primarily because of the dissipation of this parasitic component stored energy in resistors 16 and 19 with a time constant that is primarily due to the resistance values of these two resistors in parallel and the capacitance value of capacitor 14. As before, the switching transients are considered to have expired sufficiently for switching purposes when they have decayed below the 0.5 LSB value (assuming a digital data conversion application of the track-and-hold amplifier system again) which has been shown at the waveform intersection with a horizontal line at the point of one of the vertical arrows to the right of the upper waveform in FIG. 2B. This point has occurred at approximately 135 ns after the point of switching to the track mode.

This last time duration, the time after switching to the track mode until it would be possible to switch again to the hold mode with an acceptable accuracy based on the 0.5 LSB criteria, can be significantly shortened by the addition of a further switch. This switch, 23, is shown in FIG. 1 and is again formed of a p-channel, junction field-effect transistor, but in this instance having its gate brought out to a further control terminal, 24. Switch 23 has its terminating region serving as drain and souce thereof, connected from the juncture of resistors 16, 19 and switch 17 to the juncture of resistor 20 and switch 21. Switch 23 receives a control signal at control input 24 which switches to opposite voltage values from those appearing at control input 22, i.e. the control signals at these two control inputs will be logical complements of one another. That is, if control input 22 has a positive voltage for closing switches 17 and 21, there will be a zero voltage appearing on control input 24 for opening switch 23, and vice versa. Thus, switch 23 will close when switches 17 and 21 are open but will open when switches 17 and 21 are closed.

The result is that switch 23 will close when the track-and-hold amplifier system of FIG. 1 enters the hold mode because of switches 17 and 21 opening. As a result, the stored energy which has built up in the parasitics associated with inverting input 11 of operational amplifier 10 during the hold mode will no longer be isolated from the circuitry connected to the other side of the amplifier at non-inverting input 12. That is, the storing of charge on parasitic capacitances associated with inverting input 11 will not be totally unbalanced by the absence of any such charging of parasitic capacitances associated with input 12, as occurs in the absence of switch 23. Instead, the charging of parasitic capacitances on both sides of the input of operational amplifier 10 will lead to a common signal component occurring at these inputs which, after closure of switches 17 and 21 to start the track mode, will be reduced by the common mode signal ratio of operational amplifier 10 resulting in a smaller transient lasting a shorter time at the beginning of the track mode.

Figure 2B:
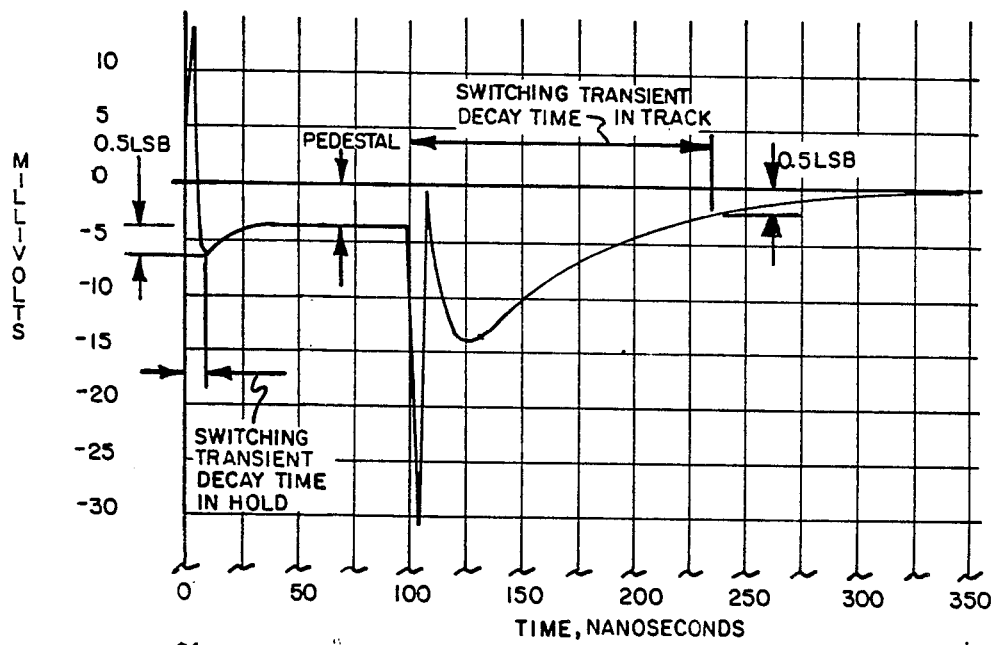
Figure 2B:
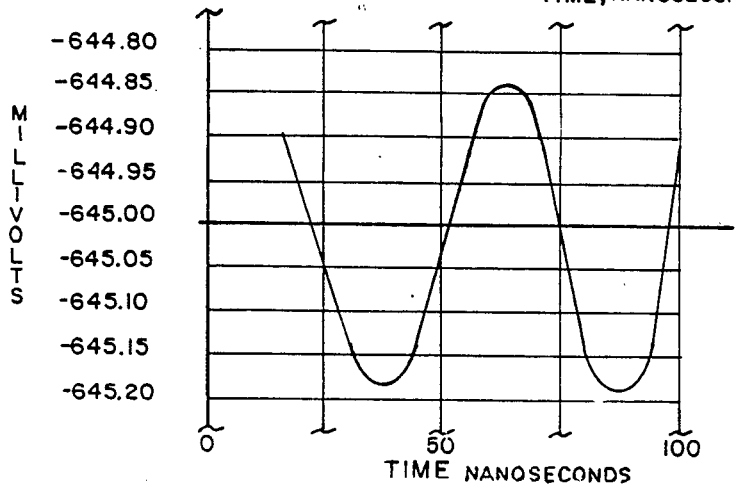
Figure 2C:
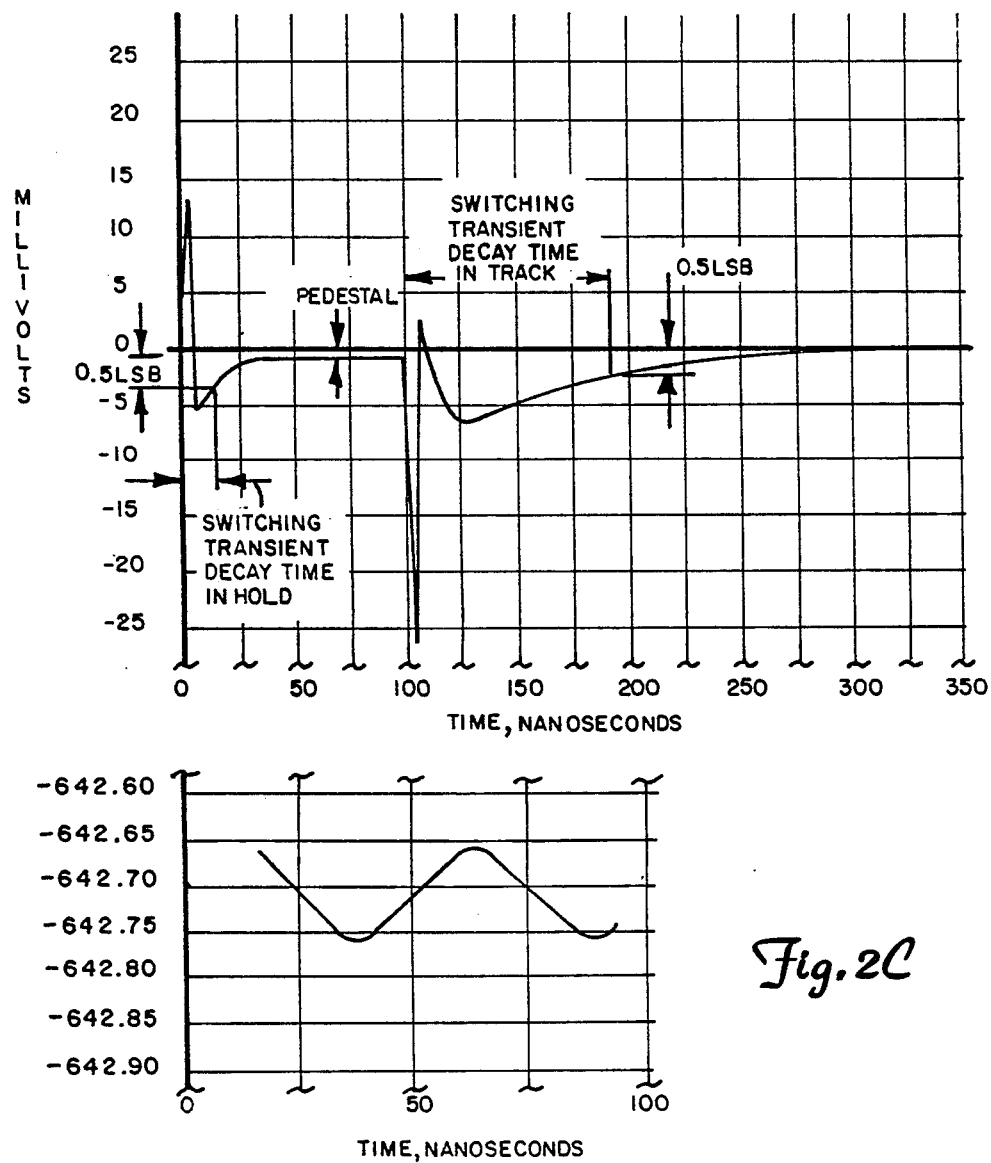

This can be seen in the upper waveform shown in FIG. 2C which represents the circuit of FIG. 1 with switch 23 present, and with the waveform of FIG. 2A applied to control input 22, its logical complement applied to control input 24, and zero volts applied to system input 18. As can be seen, there is a negative excursion of the output voltage of operational amplifier 10, and so the system output voltage, following the negative voltage spike (and a slight subsequent positive spike), which represents the discharging of the parasitics and the delaying of the initial track mode transients. This negative excursion is considerably smaller in magnitude and duration in FIG. 2C than it is in FIG. 2B. The duration using the 0.5 LSB criteria is 75 ns, a significant reduction from the 135 ns shown in FIG. 2B.

On the other hand, the negative excursion lasts slightly longer after the switching done to begin the hold mode of operation in the FIG. 2C waveform. On the whole, however, the total time of the switching transients duration in the switching sequence into the hold mode and then to the track mode is much reduced with the use of switch 23. This allows a greater rate of switching between the track and hold modes and therefore a larger number of digital conversions if the track-and-hold amplifier system is used for such purpose. The difference in "pedestal" voltage in FIGS. 2B and 2C occurs because of the introduction of additional parasitic capacitance associated with the junction field-effect transistor of switch 23.

A further benefit is shown in the lower graph portions in FIGS. 2B and 2C in connection with input signal feedthrough to the system output. These graph portions each are taken at a more negative voltage portion of the graphs in the holding mode part and have an expanded time scale for the hold mode part. In the hold mode, signal changes occurring on input 18 will have some effect at the output of operational amplifier 13, and so the system output. This will occur because of voltage divider action occurring across resistors 16 and 19 and the output impedance of operational amplifier 10, and because of capacitive coupling to only inverting input 11 through the parasitic capacitances associated with switch 17 in the absence of switch 23. If a signal is introduced at input 11 in the form of a sinusoidal voltage excursion about a fixed level, the corresponding sinusoidal excursion about a voltage level will appear at output 13.

An example of that is shown in FIG. 2B, where switch 23 is not used, which shows the resulting output from such an input signal on input 18 having a voltage value of approximately 350 μV peak-to-peak. In FIG. 2C, where switch 23 is used and is closed during the hold mode, this same signal is shown to yield a peak-to-peak voltage of less than 100 μV. This improvement occurs because of the introduction of the feedthrough signal to the non-inverting input 12 side of amplifier 10 by coupling it also through the parasitic capacitances associated with switch 21 because of the closure of switch 23. The common mode aspects of the signals coupled to both of the inputs of operational amplifier 10 through the parasitics associated with switches 17 and 21 are then suppressed by the common mode rejection capability of amplifier 10. Thus, switch 23 provides a reduction in feedthrough in the track-and-hold amplifier system.

Although the present invention has been described with reference to preferred embodiments, workers skilled in the art will recognize that changes may be made in form and detail without departing from the spirit and scope of the invention.

What is claimed is:

1. An amplifier system switchable between operating modes, including first and second operating modes, and having a system signal input region and a system signal output region, said system comprising:

a signal amplifier having a first input region and a second input region, each of which exhibits a relatively high circuit impedance, and having an output region which exhibits a relatively low circuit impedance, said signal amplifier being capable of providing at said output region a signal in a first magnitude direction substantially similar to a sign provided at said first input region in said first magnitude direction but of a greater magnitude in said first magnitude direction, and being further capable of providing at said output region a signal in a second magnitude direction substantially similar to a signal provided at said second input region in said first magnitude direction but of a greater magnitude in said second magnitude direction;

first, second and third switching means each having first and second terminating regions and having a control region by which it is capable of being directed to provide a conductive path between its first and second terminating regions, said first switching means first terminating region being electrically connected to said signal amplifier second input region, said second switching means first terminating region being electrically connected to said signal amplifier first input region, said third switching means first terminating region being electrically connected to said first switching means second terminating region, and said third switching means second terminating region being electrically connected to said second switching means second terminating region;

a feedback capacitive means electrically connected between said signal amplifier output region and said signal amplifier second input region; and first, second and third resistive means with said first resistive means electrically connected between said signal amplifier output region and said first switching means second terminating region, with said second resistive means electrically connected between said first switching means second terminating region and said amplfier system signal input region, and with said third resistive means electrically connected between said second and third switching means second terminating regions and a first terminal means adapted for connection to a first voltage source.

2. The apparatus of claim 1 wherein said first switching means control region and said second switching means control region are electrically connected to one another.

3. The apparatus of claim 2 wherein said first, second and third switching means are field-effect transistor means having sources and drains serving as said first and second terminating regions thereof.

4. The apparatus of claim 3 wherein said signal amplifier is an operational amplifier means having a non-inverting input serving as said first input region thereof, an inverting input serving as said second input region thereof, and an output serving as said output region thereof.

5. The apparatus of claim 1 which further comprises a compensation capacitive means electrically connected between said signal amplifier first input region and said first terminal means.

6. The apparatus of claim 5 wherein said feedback capacitive means, and said compensation capacitive means are of substantially similar capacitance values.

7. The apparatus of claim 1 wherein said third resistive means has a resistance value substantially equal to that resistance value obtained if said first resistive means and said second resistive means were electrically connected in parallel.

* * * * *

UNITED STATES PATENT AND TRADEMARK OFFICE
CERTIFICATE OF CORRECTION

PATENT NO. : 4,779,012

DATED : October 18, 1988

INVENTOR(S) : Alfi Moscovici

It is certified that error appears in the above-identified patent and that said Letters Patent is hereby corrected as shown below:

Column 7, line 32, delete "sign" and insert --signal--.

Signed and Sealed this

Fourteenth Day of March, 1989

*Attest:*

DONALD J. QUIGG

*Attesting Officer*  *Commissioner of Patents and Trademarks*